United States Patent
Fukunaga et al.

(10) Patent No.: US 6,730,596 B1
(45) Date of Patent: May 4, 2004

(54) METHOD OF AND APPARATUS FOR FORMING INTERCONNECTION

(75) Inventors: Akira Fukunaga, Tokyo (JP); Kuniaki Horie, Tokyo (JP); Naoaki Ogure, Tokyo (JP); Takao Kato, Tokyo (JP); Akihisa Hongo, Tokyo (JP); Hiroshi Nagasawa, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/868,140

(22) PCT Filed: Oct. 13, 2000

(86) PCT No.: PCT/JP00/07110

§ 371 (c)(1),
(2), (4) Date: Jun. 15, 2001

(87) PCT Pub. No.: WO01/27983

PCT Pub. Date: Apr. 19, 2001

(30) Foreign Application Priority Data

Oct. 15, 1999 (JP) .............................. 11/294501

(51) Int. Cl.⁷ ......................................... H01L 21/4763
(52) U.S. Cl. ....................... 438/660; 438/672; 438/675; 438/681; 438/662
(58) Field of Search ................. 438/672, 674, 438/675, 678, 681, 660, 661, 662, 663

(56) References Cited

U.S. PATENT DOCUMENTS

| | | | | |
|---|---|---|---|---|
| 5,292,393 A | * | 3/1994 | Maydan et al. ............. | 156/345 |
| 5,559,057 A | * | 9/1996 | Goldstein ................... | 438/725 |
| 5,728,626 A | * | 3/1998 | Allman et al. .............. | 438/608 |
| 5,810,988 A | * | 9/1998 | Smith, Jr. et al. ........... | 204/666 |
| 5,861,066 A | * | 1/1999 | Moinpour et al. ............. | 134/6 |
| 5,953,629 A | * | 9/1999 | Imazeki et al. ............. | 438/679 |
| 6,102,993 A | * | 8/2000 | Bhandari et al. .......... | 106/1.18 |
| 6,184,131 B1 | * | 2/2001 | Sugai ......................... | 438/660 |
| 6,214,259 B1 | * | 4/2001 | Oda et al. ................... | 252/500 |
| 6,248,658 B1 | * | 6/2001 | Buynoski ................... | 438/622 |
| 6,277,740 B1 | * | 8/2001 | Goldstein ................... | 438/600 |
| 6,294,401 B1 | * | 9/2001 | Jacobson et al. ............. | 438/99 |
| 6,328,804 B1 | * | 12/2001 | Murzin et al. .............. | 118/715 |
| 6,337,276 B1 | * | 1/2002 | Pyo ............................. | 438/687 |
| 6,358,611 B1 | | 3/2002 | Nagasawa et al. | |
| 6,440,843 B1 | * | 8/2002 | Wada et al. ................ | 438/635 |

FOREIGN PATENT DOCUMENTS

| | | |
|---|---|---|
| EP | 901 153 A2 | 3/1999 |
| EP | 903 774 A2 | 3/1999 |
| JP | 03-034211 A | 2/1991 |
| JP | 59-003952 A | 1/1994 |
| JP | 9-134891 A | 5/1997 |
| JP | 11-097392 A | 4/1999 |
| JP | 11-152597 A | 6/1999 |
| JP | 11-154653 A | 6/1999 |
| JP | 2000-173948 A | 6/2000 |

* cited by examiner

*Primary Examiner*—Matthew Smith
*Assistant Examiner*—Renzo N Rocchegiani
(74) *Attorney, Agent, or Firm*—Browdy and Neimark, P.L.L.C.

(57) ABSTRACT

The present invention relates particularly to a method of and an apparatus for forming a fine interconnection in a highly integrated circuit formed on a semiconductor substrate. The method has the steps of preparing a substrate having fine recesses formed in a surface thereof, dispersing ultrafine particles made at least partly of a metal in a predetermined solvent, producing an ultrafine particle dispersed liquid, supplying the ultrafine particle dispersed liquid to the fine recesses of the substrate, heating the substrate to melt and bond the metal, and chemical mechanical polishing the surface of the substrate to remove an excessively attached metal therefrom. According to the present invention, it is possible to stably deposit an interconnection metal of good quality using an inexpensive material.

9 Claims, 9 Drawing Sheets

F I G. 1 2
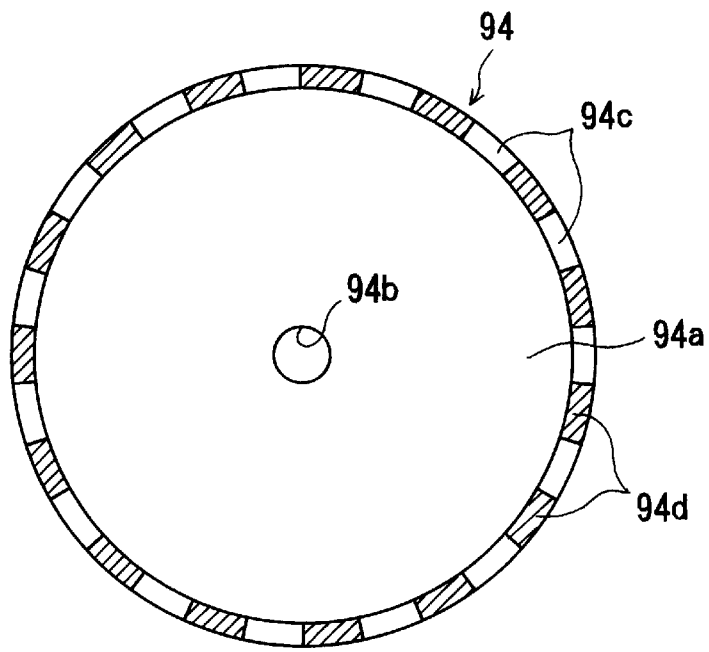
F I G. 1 3
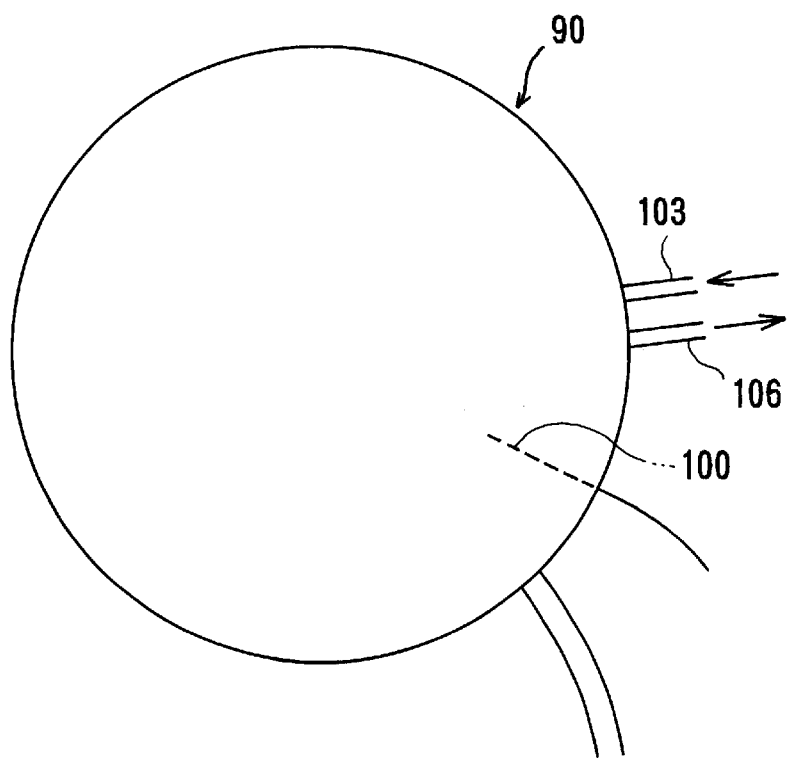

F I G. 1 4
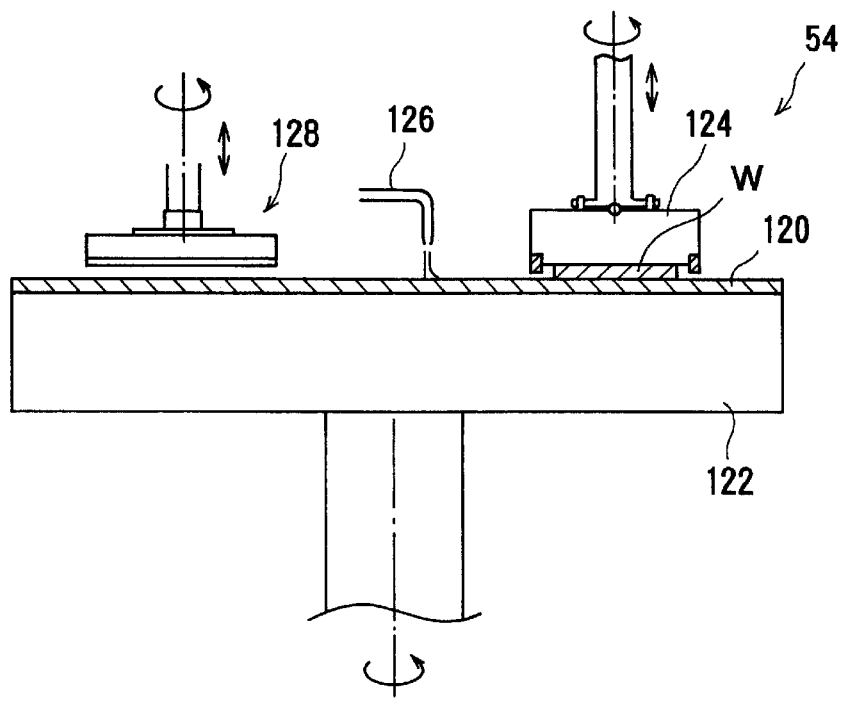
F I G. 1 5
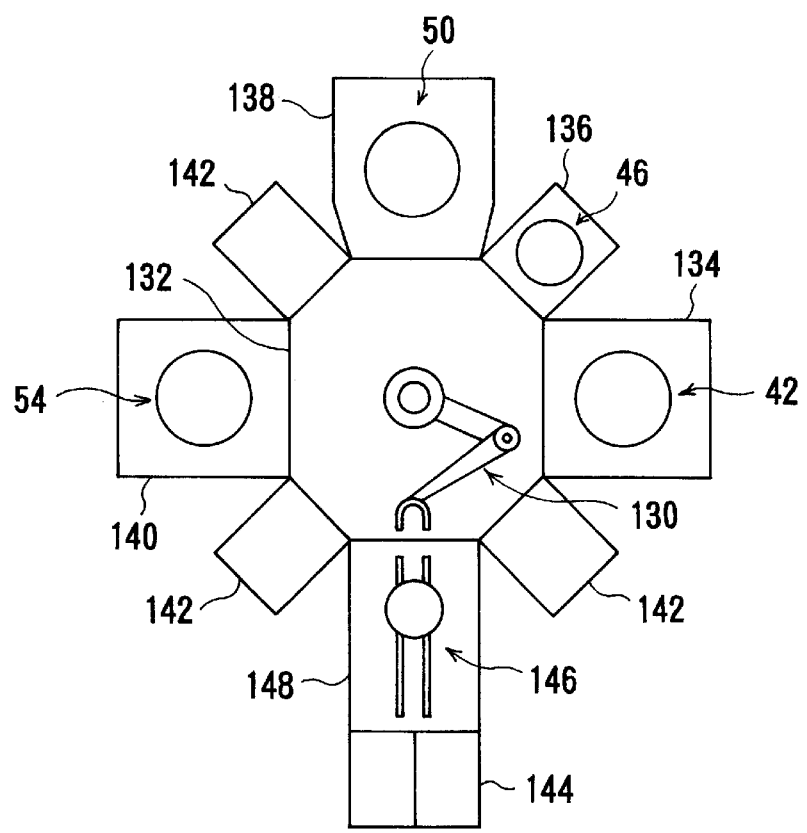

METHOD OF AND APPARATUS FOR FORMING INTERCONNECTION

REFERENCE TO RELATED APPLICATIONS

The present application is the national stage under 35 U.S.C. §371 of international application PCT/JP00/07110, filed Oct. 13, 2000 which designated the United States, and which application was not published in the English language.

TECHNICAL FIELD

The present invention relates to a method of and an apparatus for forming an interconnection, and more particularly to a method of and an apparatus for forming a fine interconnection in a highly integrated circuit formed on a semiconductor substrate such as a semiconductor wafer or the like.

BACKGROUND ART

Aluminum or aluminum alloy has generally been used as a material for forming interconnection circuits on semiconductor substrates. It has been customary to grow a film of the material according to a process such as sputtering, CVD, or the like and then produce a pattern in the film according to etching or the like. As the level of circuit integration increases in recent years, there is a demand for the usage of silver, copper or its alloy, which has a higher conductivity, as an interconnection material. Since it is difficult to etch these materials, it has been proposed to immerse a substrate having interconnection pattern trenches therein in a plating liquid and perform electrolytic or electroless plating on the substrate to embed the trenches with silver, copper or its alloy.

However, while the plating processes are an inexpensive and highly technically accomplished technology, the electrolytic plating process is capable of growing a film only on an electrically conductive material, whereas the electroless plating process suffers a problem in that substances contained in the plating liquid affect the natural environment and the working environment. Accordingly, there has been a strong need for the development of a metal interconnection technology as a substitute for the plating processes.

DISCLOSURE OF INVENTION

The present invention has been made in view of the foregoing problems and demand. It is an object of the present invention to provide a method of and an apparatus for forming an interconnection by stably depositing an interconnection metal of good quality as a substitute for the conventional plating processes.

According to an invention described in claim 1, there is provided a method of forming an interconnection, comprising the steps of preparing a substrate having fine recesses formed in a surface thereof, dispersing ultrafine particles made at least partly of a metal in a predetermined solvent, producing an ultrafine particle dispersed liquid, supplying the ultrafine particle dispersed liquid to the fine recesses of the substrate, heating the substrate to melt and bond the metal, and chemical mechanical polishing the surface of the substrate to remove an excessively attached metal therefrom.

With the above arrangement, it is possible to easily form interconnections according to so-called single and dual damascene processes.

The ultrafine particle dispersed liquid may be placed in a container, providing a liquid reservoir, and the substrate may be immersed in the liquid reservoir to supply the ultrafine particle dispersed liquid to only the fine recesses of the substrate. Alternatively, the ultrafine particle dispersed liquid may be supplied to the fine recesses of the substrate by being coated or sprayed in the fine recesses of the substrate and/or on areas surrounding the fine recesses. Furthermore, the ultrafine particle dispersed liquid may be coated by a spin coating process.

According to an invention described in claim 2, the method according to claim 1 comprises the step of evaporating the solvent between the step of supplying the ultrafine particle dispersed liquid to the fine recesses of the substrate and the step of heating the substrate to melt and bond the metal.

According to an invention described in claim 3, in the method according to claim 1 or 2, each of the ultrafine particles comprises an ultrafine composite metal particle comprising a core made substantially of a metal component and a covering layer made of an organic substance chemically bonded to the core.

For manufacturing ultrafine particles made at least partly of a metal, there has been proposed a process of evaporating the metal in a vacuum in the presence of a small amount of a gas to agglomerate ultrafine particles made of only the metal from the gas phase, producing ultrafine metal particles. Such a physical process, however, does not lend itself to mass production as the amount of generated ultrafine metal particles is small, and is costly because a device for generating an electron beam, a plasma, or a laser beam, etc. or a device for performing inductive heating is necessary to evaporate the metal. In addition, since the particle diameters range in a wide distribution, some of the metal particles remain unmelted when heated, failing to obtain a uniform metal film of low resistance.

When ultrafine particles made of only the metal is used, the ultrafine particles tend to agglomerate in a dispersed liquid, the ultrafine particle dispersed liquid is liable to provide an irregular covering layer. One solution would be to add a suitable surface active agent to the ultrafine particle dispersed liquid to turn them into a protective colloid. However, such a protective colloid fails to provide sufficient dispersion stability.

The bonded structure of ultrafine composite metal particles according to the present invention appears to be such that a core made of a metal component and an organic compound making up a covering layer share metal molecules, or an organic compound and a core form a complex-analogous structure by way of an ionic bond, through the details of the bonded structure are not clear. Since such ultrafine composite metal particles can be produced by a chemical process in a liquid phase, they can be mass-produced at a reduced cost in an ordinary atmospheric environment with a simple apparatus without the need for a large vacuum device. Since the ultrafine composite metal particles have a uniform diameter, all the ultrafine composite metal particles are fused together at a constant temperature. Inasmuch as the ultrafine composite metal particles are covered with an organic metal compound therearound, their ability to agglomerate in a solvent is small, and hence they can easily be scattered uniformly over the surface of the substrate. The ultrafine composite metal particles are stable and hence can easily be handled. Even after the solvent is evaporated, the ultrafine composite metal particles remain chemically stable until they are decomposed with heat and can be handled for easy process management.

According to a method described in claim 4, in the claim according to any one of claims 1 through 3, the ultrafine particles have an average diameter ranging from 1 to 20 nm.

It is known that the melting point of a metal particle is lowered as the diameter thereof is reduced. This effect starts to manifest itself when the diameter of the metal particle is 20 nm or less, and becomes distinctive when the diameter of the metal particle is 10 nm or less. Therefore, the average diameter of the ultrafine particles are preferably in the range from 1 to 20 nm, and preferably in the range from 1 to 10 nm depending on the shape and dimensions of the fine recesses and the structure of the semiconductor device.

According to a method described in claim 5, in the method according to any one of claims 1 through 4, the ultrafine particle dispersed liquid has a predetermined surface tension to increase adhesiveness of the ultrafine particle dispersed liquid to the fine recesses of the substrate and/or areas surrounding the fine recesses.

With the ultrafine particle dispersed liquid having a predetermined surface tension, the applicability of the ultrafine particle dispersed liquid in the fine recesses of the substrate and on areas surrounding the fine recesses is increased. Thus, the substrate with a large amount of liquid held thereon can be dried, so that a sufficient amount of ultrafine particles can be supplied to the recesses and the areas surrounding the fine recesses. Consequently, it is not necessary to repeat the applying and drying steps, and the fine recesses can be filled with the metal according to a simple process.

According to an invention described in claim 6, in the method according to any one of claims 1 through 5, the step of heating the ultrafine particles is carried out under the control of an atmosphere. With this arrangement, an oil mist produced when the ultrafine particles are decomposed is removed from the substrate surface by a nitrogen gas, for example. Therefore, the oil mist is prevented from fuming and becoming stagnant on the substrate surface to contaminate the substrate.

According to an invention described in claim 7, in the method according to claim 6, the step of heating the substrate is carried out in an inactive gas atmosphere containing a small amount of oxygen or ozone, and thereafter in a pure inactive gas atmosphere. The oxygen or ozone acts as a catalyst to separate the organic substance and the metal from each other, thus promoting the decomposition of the ultrafine particles. For example, when interconnections are to be formed using ultrafine particles of silver, the ultrafine composite metal particle layer is heated (baked) while a nitrogen gas containing a small amount of oxygen or ozone is flowing, and thereafter a nitrogen gas containing hydrogen is supplied to reduce the silver to form interconnections of pure copper, after which the gas is changed to a nitrogen gas. In this manner, the interconnections can be formed efficiently.

According to an aspect of the invention, the step of heating the substrate is carried out at a temperature of 450° C. or lower. In this manner, any thermal effect on the semiconductor substrate and circuits formed thereon can be reduced.

According to another aspect of the invention, there is provided a method of fabricating a semiconductor wafer by forming an interconnection on a surface of a substrate.

According to a further aspect of the invention, there is provided an apparatus for forming an interconnection, comprising a dispersed liquid supply device for supplying an ultrafine particle dispersed liquid produced by dispersing ultrafine particles made at least partly of a metal in a predetermined solvent, to a surface of a substrate having fine recesses formed therein; and a heat-treating device for heating the substrate to melt and bond the metal.

According to still another aspect of the invention, the apparatus further comprises a polishing device for chemical mechanical polishing the surface of the substrate to remove an excessively attached metal therefrom.

According to still a further aspect of the invention, the dispersed liquid supply device also evaporates the solvent in the ultrafine particle dispersed liquid supplied to the surface of the substrate.

According to yet another aspect of the invention, the apparatus further comprises a supplementary drying device for supplementarily drying the solvent in the ultrafine particle dispersed liquid supplied to the surface of the substrate. With this arrangement, it is possible to completely dry up an organic solvent which cannot be fully dried up by a spin drying process (air drying process) using a spin coater or the like, thus preventing voids from being produced in a heating process.

According to yet a further aspect of the invention, the heat-treating device is arranged to heat the substrate under the control of an atmosphere.

According to another option of the invention, the heat-treating device has a heating plate which houses a heater for heating the substrate at a temperature of 450° C. or lower and a cooling mechanism.

According to a further option of the invention, the respective devices are sequentially arranged in an indoor facility along a direction in which the substrate moves. With this arrangement, corresponding steps can successively be performed by the devices in the sequence.

According to yet another option of the invention, the respective devices are accommodated individually in respective chambers disposed radially around a central transfer chamber with a transfer robot disposed therein. With this arrangement, corresponding steps can be individually performed and can be combined with each other.

According to yet a further option of the invention, each of the ultrafine particles comprises an ultrafine composite metal particle comprising a core made substantially of a metal component and a covering layer made of an organic substance chemically bonded to the core.

According to still another option of the invention, the ultrafine particles have an average diameter ranging from 1 to 20 nm.

According to still a further option of the invention, there is provided a dispersed liquid supply device for supplying an ultrafine particle dispersed liquid produced by dispersing ultrafine particles made at least partly of a metal in a predetermined solvent, to a surface of a substrate, comprising: a substrate holder for holding and rotating the substrate; a dispersed liquid supply nozzle for dropping the ultrafine particle dispersed liquid to the surface of the substrate held by the substrate holder at a central portion thereof or an area surrounding the central portion; a bevel washing nozzle for supplying a washing liquid to a bevel of the substrate held by the substrate holder; and a reverse side washing nozzle for supplying a gas or a washing liquid to the reverse side of the substrate held by the substrate holder.

While the substrate is being rotated, the ultrafine particle dispersed liquid is dropped onto the center of the surface of the substrate to uniformly coat the surface of the substrate with the ultrafine particle dispersed liquid. At the same time, the bevel washing nozzle supplies the washing liquid to the bevel of the substrate to prevent the ultrafine particle dispersed liquid from dropping from the edge of the substrate and flowing across the edge of the substrate to the reverse side of the substrate. The reverse side washing nozzles also supplies the gas or the washing liquid to the reverse side of the substrate to prevent the reverse side of the substrate from being contaminated.

According to another alternative of the present invention, there is provided a heat-treating device for heating ultrafine particles made at least partly of a metal to melt and bond the metal, comprising a heating plate for holding and heating the substrate, and a housing having a gas supply port and a gas discharge port and surrounding a space above the substrate held by the heating plate to form a gas chamber between the housing and the heating plate.

By supplying a predetermined gas into and discharging same from the gas chamber defined between the heating plate and the housing, the ultrafine particles are heated under the control of an atmosphere so that an oil mist produced when the ultrafine particles are decomposed is removed from the substrate surface, and prevented from fuming and becoming stagnant on the substrate surface to contaminate the substrate.

BRIEF DESCRIPTION OF DRAWINGS

FIG. 12 is a bottom view of a housing of the heat-treating device of the apparatus for forming an interconnection according to the present invention;

FIG. 13 is a plan view of a heating plate of the heat-treating device of the apparatus for forming an interconnection according to the present invention;

FIG. 14 is a schematic view of a polishing device of the apparatus for forming an interconnection according to the present invention; and FIG. 15 is a plan view showing the layout of another apparatus for forming an interconnection according to the present invention.

BEST MODE FOR CARRYING OUT THE INVENTION

An embodiment according to the present invention will be described below with reference to the drawings. The embodiment will be used as one type of a so-called dual-damascene process for forming interconnections of copper or silver layers in fine recesses such as interconnection trenches defined in the surface of a semiconductor substrate and vertical holes, referred to as contact holes, that interconnect layers.

Figure 1A:
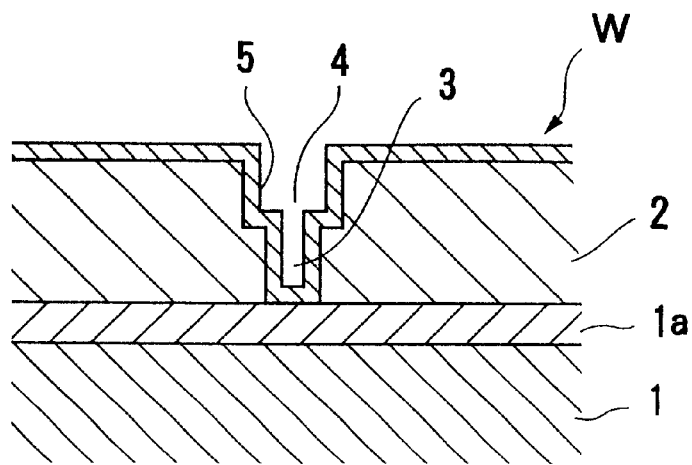
FIG. 1 is a view showing steps of a method of forming an interconnection according to the present invention.
Figure 1B:
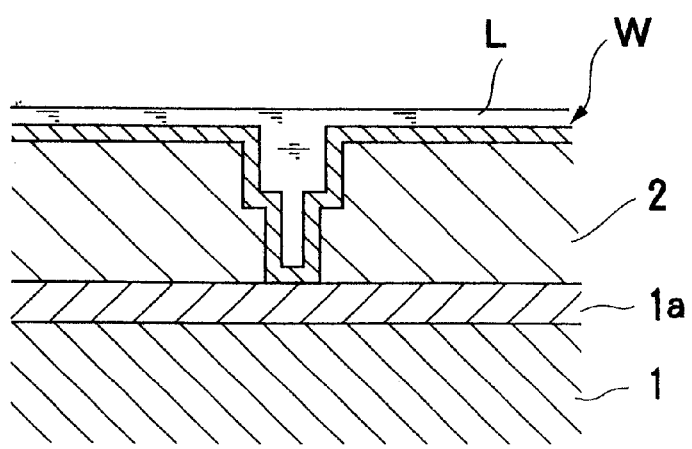
Figure 1C:
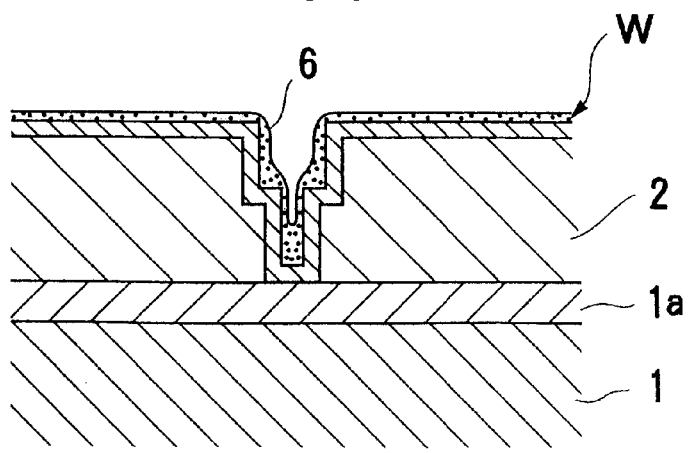

FIGS. 1A through 1C show successive steps of a method of forming an interconnection according to the present invention. As shown in FIG. 1A, a semiconductor substrate W includes a semiconductor base 1 with a semiconductor device formed thereon, an electrically conductive layer 1a disposed on the semiconductor base 1, an insulating film 2 of $SiO_2$ deposited on the electrically conductive layer 1a and having a contact hole 3 and an interconnection trench 4 defined therein by lithography and etching, and a barrier layer 5 of TaN or the like deposited on the surface formed so far.

Figure 2A:
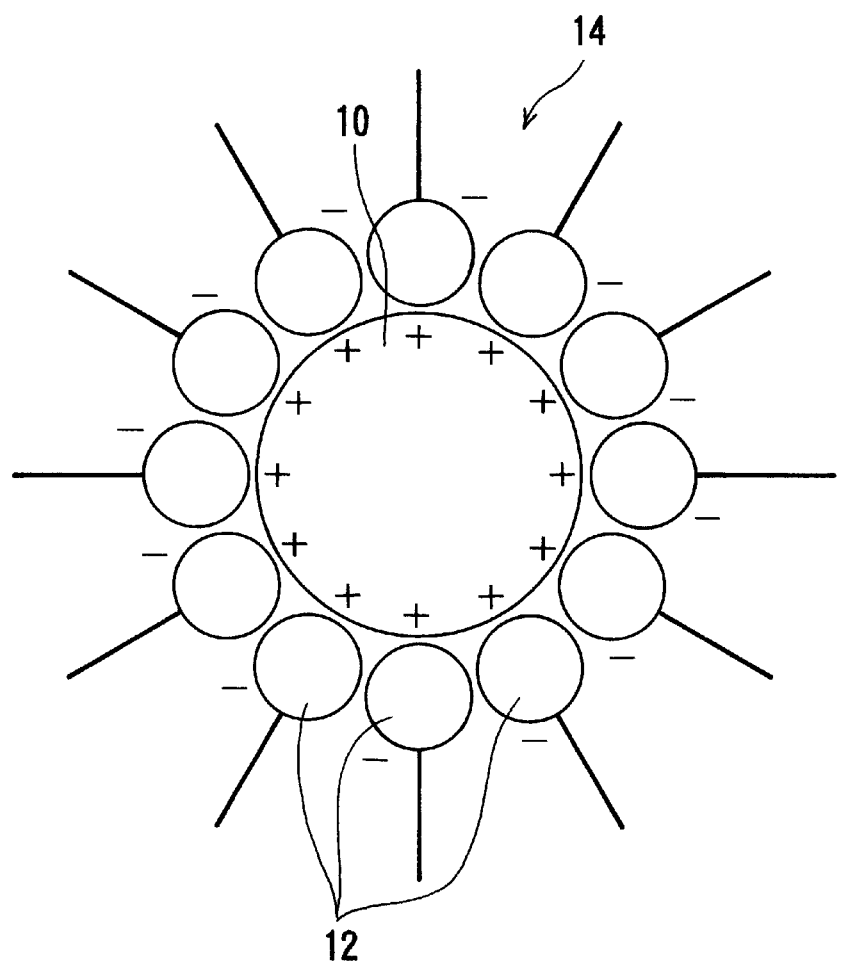
FIG. 2 is a view schematically showing the structure of a superfine particle as a material.
Figure 2B:
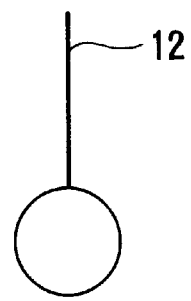

An ultrafine particle dispersed liquid L (see FIG. 1B) is prepared which comprises, as shown in FIGS. 2A and 2B, ultrafine composite metal particles 14 each comprising a core 10 substantially made of a metal component and a covering layer 12 made of an organic compound and dispersed in a given solvent. The ultrafine composite metal particles 14 are stable because their cores 10 are covered with the covering layers 12 of an organic compound, and have a small tendency to agglomerate in the solvent.

The ratio of the metal component in the ultrafine composite metal particles 14 usually ranges from 50 to 90 weight %. For use in interconnection trenches, the ratio of the metal component in the ultrafine composite metal particles 14 is usually in the range from 60 to 90 weight %, and preferably in the range from 70 to 90 weight %.

Each of the ultrafine composite metal particles 14 is composed of an organic compound and a metal component derived from a metal salt as a starting material, e.g., carbonate, formate, or acetate. Each of the ultrafine composite metal particles 14 has its central region made of the metal component and surrounded by the ionic organic compound. At this time, the organic compound and the metal component are chemically bonded partly or wholly to each other, and exist in integral unity. The ultrafine composite metal particles 14 have high stability and are stable at a higher metal concentration unlike conventional ultrafine metal particles which are stabilized by being coated with a surface active agent.

The cores 10 of the ultrafine composite metal particles 14 have an average diameter which usually ranges from 1 to 20 nm and preferably from 1 to 10 nm.

The ultrafine composite metal particles 14 can be manufactured by heating a metal salt, e.g., carbonate, formate, or acetate, in a nonaqueous solvent in the presence of an ionic organic substance at a temperature that is equal to or higher than the decomposition reducing temperature of the metal salt and also is equal to or lower than the decomposition temperature of the ionic organic substance.

The metal component comprises at least one of Cu, Ag, Au, Zn, In, Si, Sn, Pd, Fe, Co, Ni, Ru, Rh, Os, Ir, Pt, Cr, Mo, Ba, Bi, Al, W, Ta, Ti, and Pb. The ionic organic substance comprises a fatty acid having a carbon number of 5 or more, an alkylbenzene sulfonic acid, or an alkyl sulfonic acid.

The heating temperature is equal to or higher than the decomposition reducing temperature of the metal salt, e.g., carbonate, formate, or acetate, and also is equal to or lower than the decomposition temperature of the ionic organic substance. For example, if acetate is used as the metal salt, then since its decomposition starting temperature is 200° C., the metal salt may be kept at a temperature that is equal to or higher than 200° C. and low enough to keep the ionic organic substance from being decomposed. To prevent the ionic organic substance from being decomposed, the heating atmosphere should preferably be an inactive gas atmosphere. However, the metal salt may be heated in the atmosphere by selecting a nonaqueous solvent.

For heating, various alcohols may be added for accelerating the reaction. Such alcohols are not limited to any particular alcohols, but may be lauryl alcohol, glycerin, ethylene alcohol, or the like, for example, insofar as they can accelerate the reaction. The amount of the added alcohol may be determined depending on the type of the added alcohol. Usually, the alcohol is added in 5 through 20 parts by weight, preferably 5 through 10 parts by weight, with respect to 100 parts by weight of the metal salt.

After the heating, the ultrafine composite metal particles 14 are refined according to a known refining process. The refining process includes a centrifugal separation process, a film refining process, a solvent extracting process, or the like, for example.

The ultrafine composite metal particles 14 thus produced are dispersed in a suitable solvent, producing the ultrafine particle dispersed liquid L. Since the ultrafine composite metal particles 14 as dispersed particles are very small, the ultrafine particle dispersed liquid L is substantially transparent when the ultrafine composite metal particles 14 are mixed and stirred. Properties of the ultrafine particle dispersed liquid L such as surface tension, viscosity, etc. may be adjusted by appropriately selecting the type of the solvent, the concentration of the ultrafine composite metal particles and temperature, etc.

The ultrafine particle dispersed liquid L is dropped onto the substrate W at its center or a spot slightly off the center according to a spin coating process, i.e., while the substrate W is being rotated, for example. When the ultrafine particle dispersed liquid L has covered the surface of the substrate W, the dropping of the ultrafine particle dispersed liquid L is stopped, thus uniformly coating the entire interconnection forming surface of the substrate W, as shown in FIG. 1B. In this manner, a liquid film having a given thickness that is determined by the viscosity of the ultrafine particle dispersed liquid L and the surface tension acting between the substrate surface and the ultrafine particle dispersed liquid L is formed on the substrate surface.

While the ultrafine particle dispersed liquid L is being kept from dropping, the substrate W is rotated in a spin drying process (air drying process) to evaporate the solvent in the ultrafine particle dispersed liquid L, thus forming an ultrafine composite metal particle layer 6, which comprises an agglomeration of ultrafine composite metal particles as a solid material, in the small recesses (the contact hole 3 and the interconnection trench 4) and on the substrate surface, as shown in FIG. 1C.

Alternatively, a liquid film having a given thickness may be formed on the interconnection forming surface of the substrate W by immersing the substrate W in the ultrafine particle dispersed liquid L according to a dipping process. In this process, undesired areas of the substrate W may be masked, and the ultrafine particle dispersed liquid L may be stirred, or the ultrafine particle dispersed liquid L or the substrate W may be vibrated in order to fill the small recesses (the contact hole 3 and the interconnection trench 4) with the ultrafine particle dispersed liquid L.

Figure 3A:
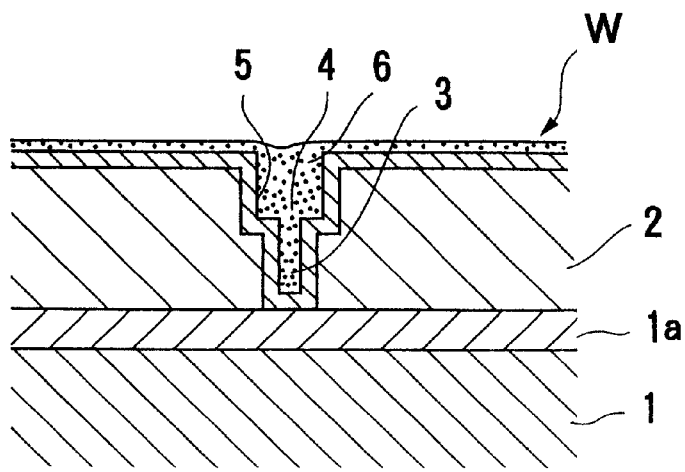
FIG. 3 is a view showing steps, which follows the steps shown in FIG. 1, of the method of forming an interconnection according to the present invention.
Figure 3B:
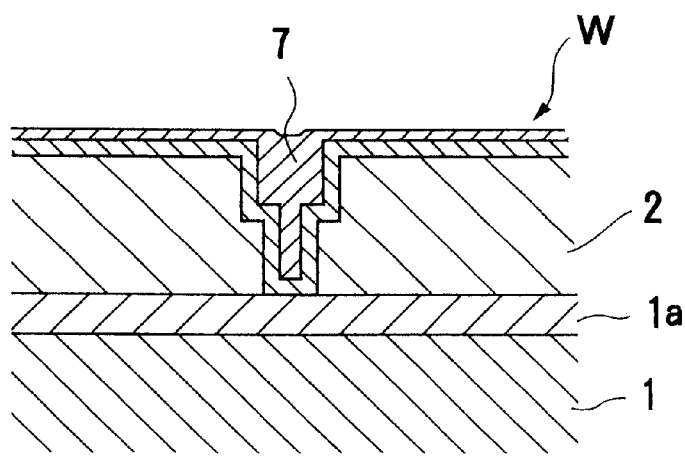

The process of applying the ultrafine particle dispersed liquid L to the interconnection forming surface of the substrate W and spin-drying the substrate W is repeated a plurality of times as required. The immersing and drying process is put to an end when the small recesses (the contact hole 3 and the interconnection trench 4) are filled to a certain level with the ultrafine composite metal particle layer 6. Thereafter, the ultrafine composite metal particle layer 6 is decomposed with heat in a controlled atmosphere by a heating furnace to melt and bond the ultrafine composite metal particles together, thus forming a metal interconnection 7, as shown in FIG. 3B.

Specifically, the ultrafine composite metal particle layer 6 is heated to 300° C. in 5 minutes, held at 300° C. for 5 minutes, and thereafter cooled to the room temperature in 10 minutes. This heating process is first carried out in an inactive gas atmosphere of $N_2$ or the like containing a small amount of oxygen or ozone, and thereafter carried out in a pure inactive gas atmosphere of only $N_2$ or the like. The oxygen or ozone acts as a catalyst to separate the organic substance and the metal from each other, thus promoting the decomposition of the ultrafine particles. An oil mist produced when the ultrafine particles are decomposed is removed from the substrate surface by the $N_2$ gas, for example. Therefore, the oil mist is prevented from fuming and becoming stagnant on the substrate surface to contaminate the substrate.

When interconnections are to be formed using ultrafine particles of silver, it is preferable that the ultrafine composite metal particle layer be heated (baked) while a nitrogen gas containing a small amount of oxygen or ozone is flowing, and thereafter a nitrogen gas containing hydrogen is supplied to prevent the silver from being oxidized and reduce the silver to form interconnections of pure silver, after which the gas is changed to a nitrogen gas. In this manner, the interconnections can be formed efficiently.

By decomposing the ultrafine composite metal particle layer with heat at a temperature of 450° C. or lower, any thermal effect on the semiconductor substrate and circuits formed thereon can be reduced.

Figure 3C:
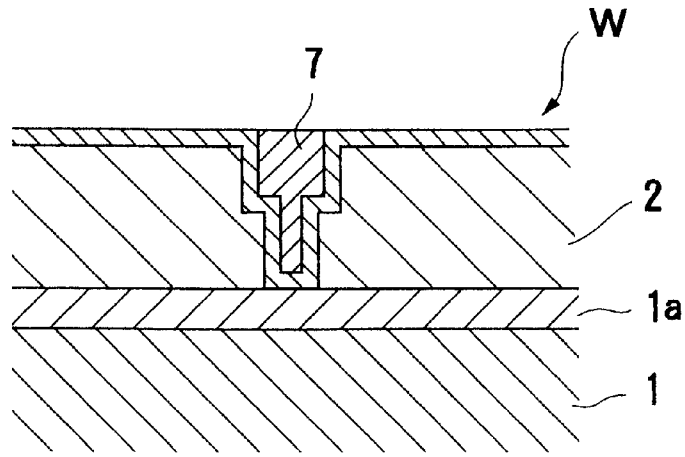

Then, as shown in FIG. 3C, the substrate is chemically and mechanically polished to remove the metal and the barrier layer that have been attached to the substrate surface. Thus, excessive interconnection fractions are removed. An insulating layer may be formed over the metal interconnection 7, and a structure as shown in FIG. 1A may be formed again on the insulating layer, after which the above steps may be repeated to produce a multilayer interconnection structure.

In the above embodiment, ultrafine composite metal particles are used as ultrafine particles, and dispersed in a solvent to produce an ultrafine particle dispersed liquid. However, the ultrafine composite metal particles may be replaced with generally known ultrafine particles made of metal only, and those ultrafine particles made of metal only may be dispersed in a solvent to produce an ultrafine particle dispersed liquid. Such a modification is also applicable to an apparatus for forming an interconnection to be described below.

An apparatus for forming an interconnection according to the present invention, which is used to carry out the above method of forming an interconnection, will be described below with reference to FIGS. 4 through 15.

Figure 4:
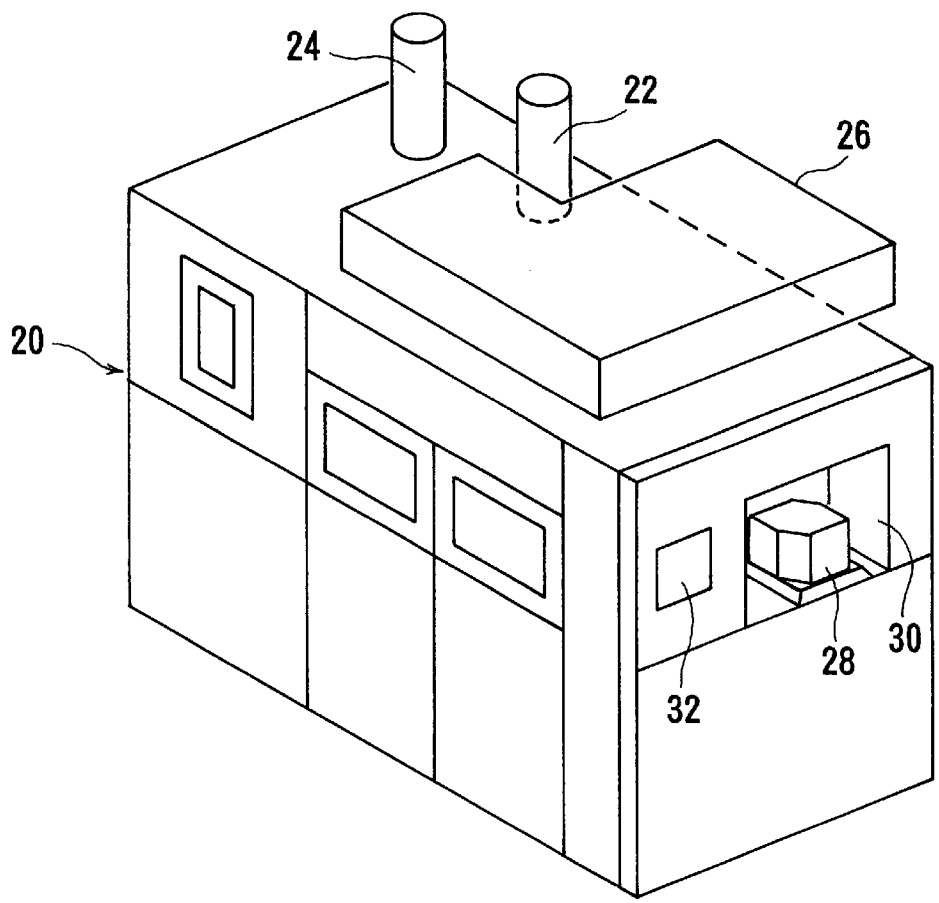
FIG. 4 is a view showing an appearance of an apparatus for forming an interconnection according to the present invention.

FIG. 4 shows a rectangular indoor facility 20 which incorporates an apparatus for forming an interconnection therein. The indoor facility 20 has on its ceiling a discharge duct 22 for discharging exhaust gases in a dispersed liquid supply section 44 and a supplementary drying section 48, described below, a discharge duct 24 for discharging exhaust gases in a heat-treating section 52, and an air-conditioning unit 26 for air-conditioning a polishing section 56, etc. The indoor facility 20 also has an inlet/outlet port 30 defined in a side wall thereof for introducing and removing a cassette 28 with substrates W housed therein and a control panel 32 mounted on the side wall.

Figure 5:
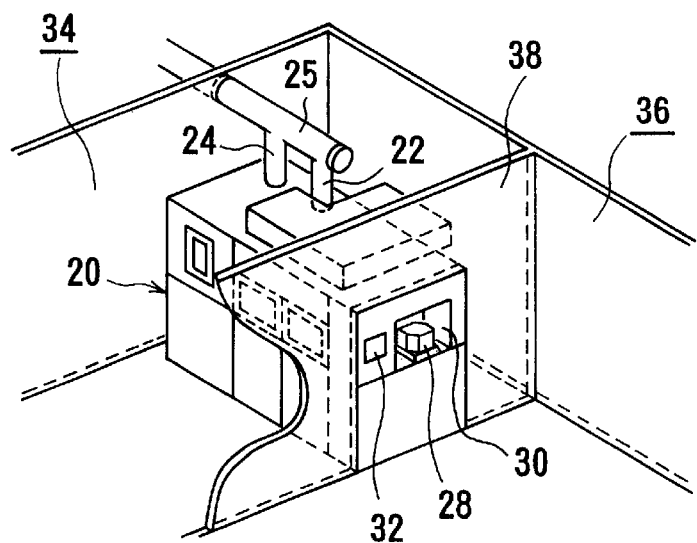
FIG. 5 is a view showing, by way of example, the apparatus for forming an interconnection according to the present invention which is disposed in a clean room.

As shown in FIG. 5, for example, the indoor facility 20 is disposed in a utility zone 34 in a clean room. The indoor facility 20 has an end positioned in an opening defined in a partition wall 38 which divides the utility zone 34 and a clean zone 36 from each other, with the inlet/outlet port 30 and the control panel 32 being exposed in the clean zone 36. The discharge ducts 22, 24 are connected to a common discharge duct 25 that extends out of the utility zone 34.

Figure 6:
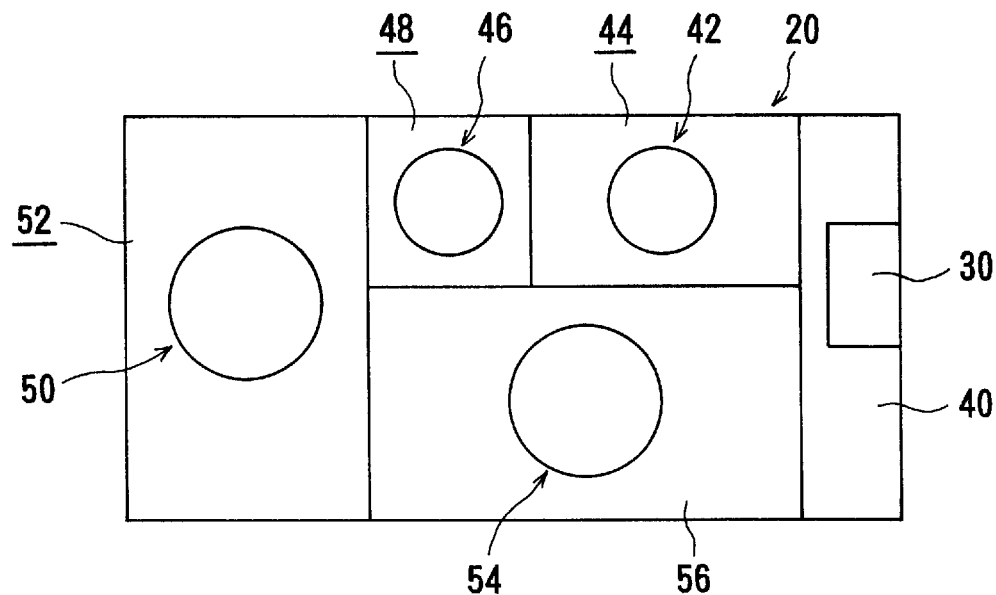
FIG. 6 is a plan view of the apparatus for forming an interconnection according to the present invention.

As shown in FIG. 6, the indoor facility 20 has its interior divided into a loading/unloading section 40 having the inlet/outlet port 30, a dispersed liquid supply section 44 housing a dispersed liquid supply device 42 therein, a supplementary drying section 48 housing a supplementary drying device 46 therein, a heat-treating section 52 housing a heat-treating device 50 therein, and a polishing section 56 housing a polishing device 54 therein. These devices 42, 46, 50, 54 are arranged in a sequence along the direction in which the substrate flows, so that a series of interconnection forming steps can successively be performed on the substrate. The dispersed liquid supply section 44 and the supplementary drying device 46 are of an explosion-proof structure in view of the explosiveness of an organic solvent.

In the present embodiment, the indoor facility 20 has a single inlet/outlet port for storing one cassette therein. However, the indoor facility may have two inlet/outlet ports for storing respective cassettes therein.

Figure 7:
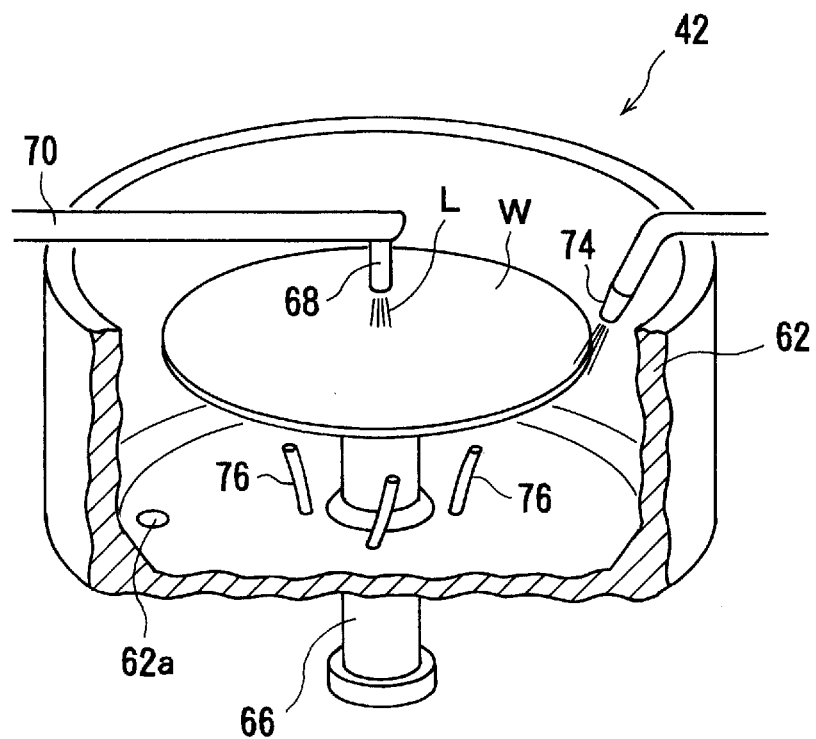
FIG. 7 is a perspective view, partly broken away, of a dispersed liquid supply device of the apparatus for forming an interconnection according to the present invention.
Figure 8:
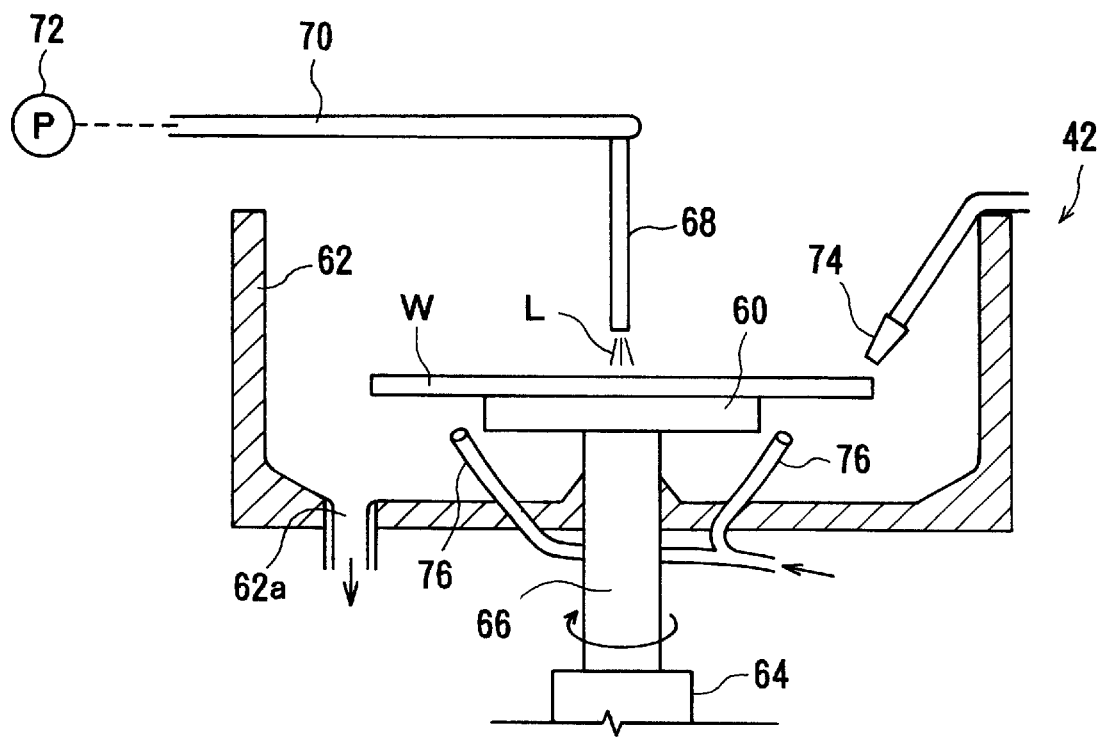
FIG. 8 is a vertical sectional front elevational view of the dispersed liquid supply device of the apparatus for forming an interconnection according to the present invention.

FIGS. 7 and 8 show the dispersed liquid supply device 42 for supplying the ultrafine particle dispersed liquid L (see FIG. 1B) to the surface of the substrate W. The dispersed liquid supply device 42 comprises a substrate holder 60 for holding and rotating the substrate W with its interconnecting forming surface (face side) oriented upwardly, and a bottomed cup-shaped scattering prevention plate 62 surrounding the substrate W that is held by the substrate holder 60. The substrate holder 60 has a vacuum chuck on its upper surface for attracting and holding the substrate W, and is connected to the upper end of a rotatable shaft 66 that extends from a servomotor 64 for rotation upon energization of the servomotor 64. The scattering prevention plate 62 is made of a material resistant to organic solvents, e.g., stainless steel.

A downwardly directed dispersed liquid supply nozzle 68 for dropping the ultrafine particle dispersed liquid L is positioned upwardly of either the center of the surface of the substrate W that is held by the substrate holder 60 or a spot slightly off the center of the surface of the substrate W. The dispersed liquid supply nozzle 68 is connected to the free end of an arm 70. The arm 70 accommodates therein a pipe for supplying a metered amount of ultrafine particle dispersed liquid. The pipe extends from a metered amount supply device 72 such as a syringe pump or the like and is communicated with the dispersed liquid supply nozzle 68.

A bevel washing nozzle 74 which is inclined downwardly inwardly is positioned above the circumferential area of the substrate W held by the substrate holder 60, for supplying a washing liquid to the bevel of the substrate W. A plurality of reverse side washing nozzles 76 which are inclined upwardly outwardly are positioned below the substrate W held by the substrate holder 60, for supplying a gas or washing liquid to the reverse side of the substrate W. The scattering prevention plate 62 has a drain hole 62a defined in its bottom.

Therefore, the substrate W is held by the substrate holder 60, and the servomotor 64 is energized to rotate the substrate W at a speed ranging from 300 to 500 rpm, for example, more preferably from 400 to 500 rpm. While the substrate W is being thus rotated, the dispersed liquid supply nozzle 68 drops a metered amount of ultrafine particle dispersed liquid L onto the central area of the surface of the substrate W. When the surface of the substrate W is covered with the ultrafine particle dispersed liquid L, the dropping of the ultrafine particle dispersed liquid L is stopped so that uniformly coat the surface of the substrate W with the ultrafine particle dispersed liquid L. At the same time, the bevel washing nozzle 74 supplies a hydrophilic organic solvent such as methanol, acetone, or the like, or a washing liquid such as ethanol, isopropyl alcohol, or the like, to the bevel of the substrate W to prevent the ultrafine particle dispersed liquid L from dropping from the edge of the substrate W or flowing across the edge of the substrate W to the reverse side of the substrate W. The reverse side washing nozzles 76 also supplies a gas such as an $N_2$ gas, air, or the like, or a washing liquid which is the same as the washing liquid supplied to the bevel of the substrate W, to the reverse side of the substrate W to prevent a contamination of the reverse side of the substrate W using the gas flow or the washing liquid.

With the dropping of the ultrafine particle dispersed liquid L being stopped, the servomotor 4 rotates the substrate W to dry the substrate W in a spin drying process (air drying process) to evaporate the solvent in the ultrafine particle dispersed liquid L coated on the substrate W.

The process of applying the ultrafine particle dispersed liquid L to the interconnection forming surface of the substrate W and spin-drying the substrate W is repeated a plurality of times as required. This process is put to an end when the small recesses (the contact hole 3 and the interconnection trench 4) are filled with a certain level by the ultrafine composite metal particle layer 6, i.e., the ultrafine composite metal particle layer 6 reaches a certain thickness.

Finally, the substrate may be rotated at a higher speed to quicken the drying of the solvent. An excessive amount of ultrafine particle dispersed liquid L and the washing liquid that has been used to wash the bevel and reverse side of the substrate are discharged out of the drain hole 62a.

Figure 9:
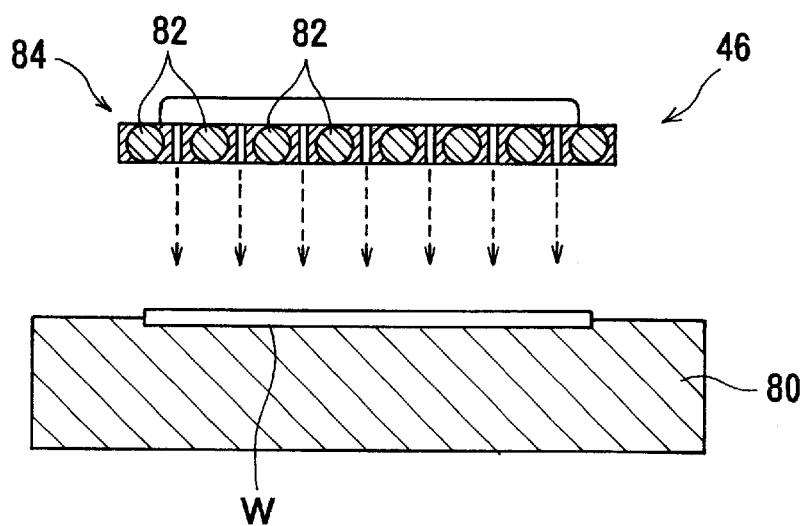
FIG. 9 is a cross-sectional view of a supplementary drying device of the apparatus for forming an interconnection according to the present invention.
Figure 10:
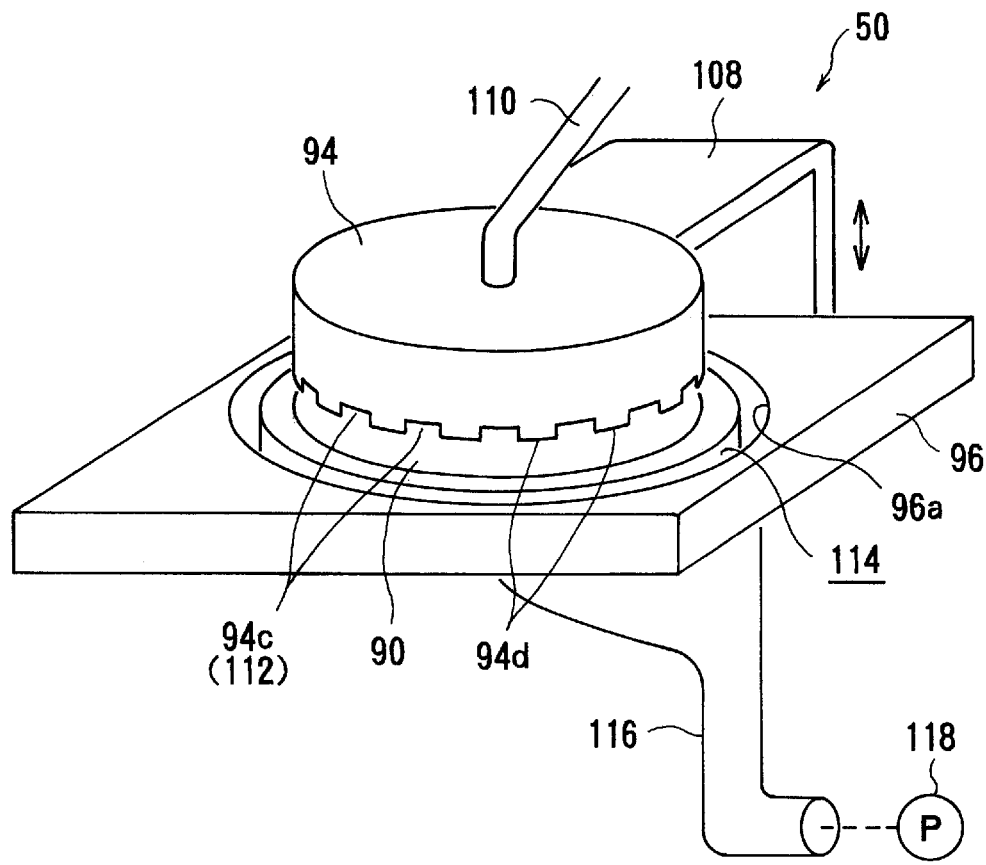
FIG. 10 is a schematic view of a heat-treating device of the apparatus for forming an interconnection according to the present invention.
Figure 11:
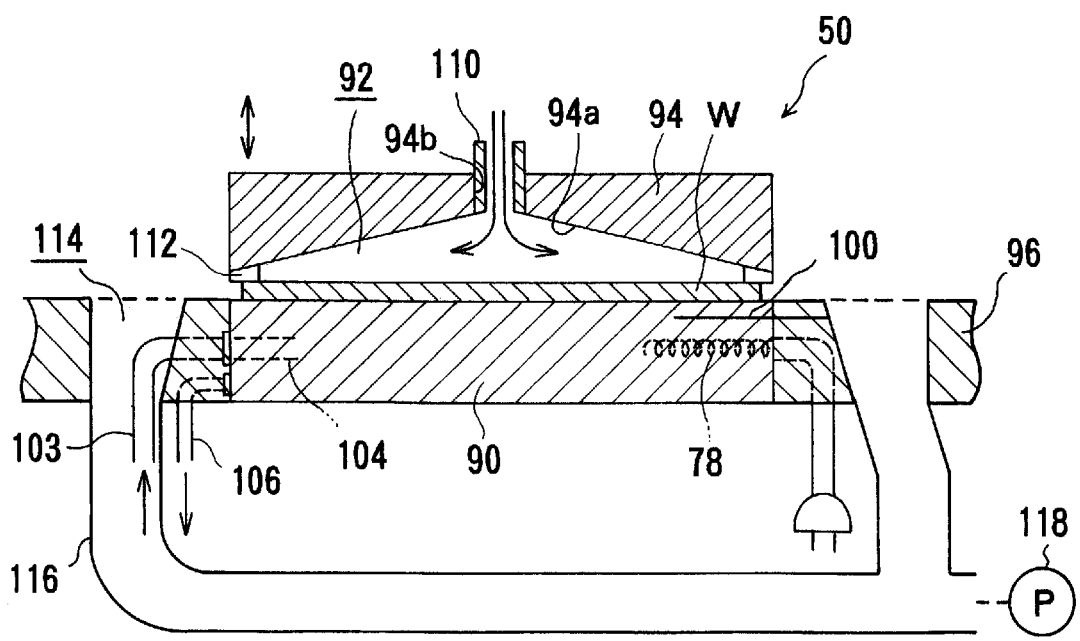
FIG. 11 is a vertical sectional front elevational view of the heat-treating device of the apparatus for forming an interconnection according to the present invention.

FIG. 9 shows the supplementary drying device 46. The supplementary drying device 46 has a substrate holding base 80 for holding the substrate W with its face side oriented upwardly and a heat-treating device 84 disposed above the substrate holding base 80, the heat-treating device 84 comprising lamp heaters 82, for example.

The supplementary drying device 46 serves to dry up the solvent that has not been evaporated by the spin drying process carried out by the dispersed liquid supply device 42. The supplementary drying device 46 may not necessarily be required if the solvent is sufficiently dried up by the spin-drying process carried out by the dispersed liquid supply device 42 such as when the solvent is coated as a very thin film.

Specifically, if the ultrafine composite metal particle layer 6 (see FIG. 3A) deposited on the surface of the substrate W is heated while the organic solvent remains in the ultrafine composite metal particle layer 6, voids may possibly be produced at the bottoms of the trenches. Such voids are prevented from occurring by completely drying up the solvent with the supplementary drying device 46. The temperature to be achieved by the supplementary drying device 46 is preferably a temperature at which the ultrafine particles are not decomposed, e.g., about 100° C., for thereby preventing a contamination of the supplementary drying device 46 which would otherwise be caused by the decomposition of the ultrafine particles.

FIGS. 10 through 13 show the heat-treating device 50 for heating the ultrafine composite metal particle layer 6 (see FIG. 3A) to melt and bond the metal together. The heat-treating device 50 has a heating plate 90 for holding and heating the substrate W with its face side directed upwardly, a housing 94 which surrounds a space above the substrate W that is held by the heating plate 90 to define a gas chamber 92 between the housing 94 and the heating plate 90, and a frame 96 which surrounds the heating plate 90.

The heating plate 90 is made of aluminum or copper, for example, which has a high heat conductivity and can uniformly be heated at a high speed, and is in the form of a disk. The heating plate 90 houses therein a heater 78 and a temperature sensor 100 for detecting the temperature of the heating plate 90. The heating plate 90 also has a coolant flow passage 104 communicating with a coolant inlet passage 103 for introducing a coolant such as a cooling gas, air, or the like. The coolant flow passage 104 communicates with a coolant outlet passage 106.

The housing 94 is made of ceramics, for example, and is fixed to the free end of a vertically movable arm 108. The housing 94 has a conical recess 94a defined in the reverse side thereof which provides the gas chamber 92 between itself and the substrate W placed on and held by the heating plate 90 when the housing 94 is displaced downwardly. Furthermore, the housing 94 has a gas supply port 94b defined centrally therein which is connected to a gas supply pipe 110. The housing 94 also has an alternately arranged succession of slits 94c and pressers 94d on its lower peripheral edge. When the housing 94 is displaced downwardly, the pressers 94d are brought into abutment against the peripheral edge of the substrate W that is placed on and held by the heating plate 90, gripping and holing the peripheral edge of the substrate W between the heating plate 90 and the pressers 94d, and the slits 94c provide gas discharge ports 112.

The frame 96 has a through hole 96a defined therein which provides a gas inlet port 114 with an inner surface thereof. A discharge duct 116 communicating with the gas inlet port 114 is fixed to the reverse side of the frame 96, and is connected to a discharge blower 118.

Therefore, the substrate W is placed on and held by the upper surface of the heating plate 90. The substrate W is heated to 300° C. in 5 minutes, for example, held at 300° C. for 5 minutes, and thereafter cooled to the room temperature in 10 minutes, thus melting and bonding the metal of ultrafine composite metal particles together. At this time, an inactive gas of $N_2$ or the like containing a small amount of oxygen or ozone is introduced from the gas supply pipe 110 into the gas chamber 92, and thereafter an inactive gas of only $N_2$ or the like is introduced from the gas supply pipe 110 into the gas chamber 92. The oxygen or ozone acts as a catalyst to separate the organic substance and the metal from each other, thus promoting the decomposition of the ultrafine composite metal particles. An oil mist produced when the ultrafine particles are decomposed is removed from the substrate surface by the $N_2$ gas, for example. Therefore, the oil mist is prevented from fuming and becoming stagnant on the substrate surface to contaminate the substrate.

The oxygen or ozone may be added in a small quantity as it would undesirably oxidize the ultrafine particles if added in an excessive amount.

When interconnections are to be formed using ultrafine particles of silver, it is preferable that the ultrafine composite metal particle layer be heated (baked) while a nitrogen gas containing a small amount of oxygen or ozone is flowing, and thereafter a nitrogen gas containing hydrogen is supplied to prevent the silver from being oxidized and reduce the silver to form interconnections of pure silver, after which the gas is changed to a nitrogen gas. In this manner, the interconnections can be formed efficiently.

FIG. 14 shows the polishing device 54 which chemically and mechanically polishes the surface of the substrate W to remove excessively attached metal therefrom. The polishing device 54 comprises a polishing table 122 with a polishing cloth (polishing pad) 120 attached to its upper surface to provide a polishing surface, and a top ring 124 for holding the substrate W with its surface to be polished being directed toward the polishing table 122. The polishing table 122 and the top ring 124 are rotated about their respective own axes. While the polishing cloth 120 is being supplied with an abrasive liquid from an abrasive liquid nozzle 126 disposed above the polishing table 122, the top ring 124 presses the substrate W under a constant pressure against the polishing cloth 120 on the polishing table 122, thereby polishing the surface of the substrate W. The abrasive liquid supplied from the abrasive liquid nozzle 126 comprises, for example, an alkaline solution containing a suspended abrasive grain which comprises fine particles of silica or the like. Therefore, the substrate W is polished to a flat and mirror finish by a chemical and mechanical polishing process based on a combination of a chemical polishing action of the alkali and a mechanical polishing action of the abrasive grain.

When the polishing device 54 continuously performs the polishing process, the polishing power of the polishing surface of the polishing cloth 120 is lowered. To recover the polishing power, a dresser 128 is provided. The polishing cloth 120 is dressed by the dresser 128, for example, when the substrate W is replaced with another substrate to be polished. In the dressing process, a dressing surface (dressing member) of the dresser 128 is pressed against the polishing cloth 120 on the polishing table 122, and the dresser 128 and the polishing table 122 are rotated about their respective own axes to remove the abrasive liquid and abatement attached to the polishing surface, and also to planarize and dress the polishing surface for thereby regenerate the polishing surface.

The apparatus for forming an interconnection, thus constructed, operates as follows: The cassette 28 with substrates W housed therein is placed in the inlet/outlet port 30, and one substrate W is taken out of the cassette 28 and delivered to the dispersed liquid supply device 42 in the dispersed liquid supply section 44. In the dispersed liquid supply device 42, the surface of the substrate W is supplied with the ultrafine particle dispersed liquid L and then spin-dried, and this process is repeated a plurality of times as required until the ultrafine composite metal particle layer 6 (see FIG. 3A) reaches a predetermined thickness. Then, the substrate W is delivered to the supplementary drying device 46 in the supplementary drying section 48. In the supplementary drying device 46, the solvent in the ultrafine composite metal particle layer 6 is evaporated. Then, the substrate W is delivered to the heat-treating device 46 in the heat-treating section 48. In the heat-treating device 46, the ultrafine composite metal particle layer 6 (see FIG. 3A) is heated to melt and bond the metal together, thus forming the metal interconnection 7 (see FIG. 3B).

The substrate W with the metal interconnection 7 formed thereon is then delivered to the polishing device 54 in the polishing section 56. In the polishing device 54, the surface of the substrate W is chemically and mechanically polished to remove excessive metal therefrom. The substrate W is then returned to the cassette 28. The apparatus for forming an interconnection is capable of successively performing the above steps in the sequence.

FIG. 15 shows another example of an apparatus for forming an interconnection. The apparatus comprises a central transfer chamber 132 having a transfer robot 130 disposed therein, a dispersed liquid supply chamber 134 housing a dispersed liquid supply device 42 therein, a supplementary drying chamber 136 housing a supplementary drying device 46 therein, a heat-treating chamber 138 housing the heat-treating device 50 therein, a polishing chamber 140 housing the polishing device 54 therein, and plurality of stockyards (temporary placing chambers) 142 disposed in given positions between these chambers. The dispersed liquid supply chamber 134, the supplementary drying chamber 136, the heat-treating chamber 138, the polishing chamber 140, and the stockyards 142 are disposed radially around the central transfer chamber 132. The apparatus also has a second transfer chamber 148 having a mobile robot 146 disposed therein, the second transfer chamber 148 being positioned between a loading/unloading chamber 144 and the central transfer chamber 132.

With the above apparatus for forming an interconnection, the dispersed liquid supply chamber 134 housing the dispersed liquid supply device 42 therein, the supplementary drying chamber 136 housing the supplementary drying device 46 therein, and the other chambers can be constructed as units. Furthermore, various processes including a dispersed liquid supply process, a supplementary drying process, etc. can be individually performed and can be combined to carry out a process of forming an interconnection.

EXAMPLE 1

Oleic acid was used as an organic anionic substance, and silver acetate was used as a metal source. 0.5 L of a naphthene-based high boiling solvent having a distilling point of 250° C. was placed into an eggplant-shaped flask having a volume of 1 L, and 10 g of silver acetate and 20 g of oleic acid were added to the solvent. The mixture was then heated at 240° C. for 3 hours. As the mixture is heated, its color changed from colorless to light brown to purple. After the mixture was heated, acetone was added to the mixture, and the mixture was then refined by way of precipitation.

The modified powder was observed by a transmissive electron microscope. The observation indicated that the powder was composed of ultrafine metal particles having a diameter of about 10 nm. An X-ray powder diffraction process conducted on the powder confirmed cores of metal silver.

The powder composed of ultrafine metal particles (ultrafine composite metal particles) was then dispersed in toluene and xylene. No precipitation was recognized in either of the solutions, which appeared to be transparent. In other words, the powder was dissolvable.

The dispersion was used as an ultrafine particle dispersed liquid, and coated on a semiconductor substrate having fine recesses at a ratio of 0.05 g per 1 cm². After the semiconductor substrate was dried, it was heated at about 250° C. in a nitrogen atmosphere. The ultrafine composite metal particles in the fine recesses were easily melted and silver interconnections were formed. The silver interconnections were measured for their resistance, which was 1.8 $\mu\Omega$·cm. The semiconductor substrate was chemically and mechanically polished using an abrasive grain of silica, well planarizing the silver interconnections in the recesses without peel-off.

EXAMPLE 2

Stearic acid was used as an organic anionic substance, and copper carbonate was used as a metal source. 0.5 L of a paraffin-based high boiling solvent having a distilling point of 250° C. was placed into an eggplant-shaped flask having a volume of 1 L, and 10 g of copper carbonate and 40 g of stearic acid were added to the solvent. The mixture was then heated at 300° C. for 3 hours. As the mixture is heated, its color changed from light green to dark green to brown. After the mixture was heated, methanol was added to the mixture, and the mixture was then refined by way of precipitation.

The powder composed of ultrafine metal particles (ultrafine composite metal particles) was then applied to a substrate in the same manner as with Example 1. However, the substrate was heated at 300° C. The ultrafine composite metal particles in the fine recesses were easily melted into copper interconnections. When the substrate was chemically and mechanically polished, the copper interconnections were well planarized without peel-off.

EXAMPLE 3

Sodium dodecylbenzenesulfonate was used as an organic anionic substance, and gold carbonate was used as a metal source. 0.5 L of xylene (isomer mixture) was placed into an eggplant-shaped flask having a volume of 1 L, and 5 of gold carbonate and 20 g of sodium dodecylbenzenesulfonate were added to the solvent. The mixture was then heated at 150° C. for 3 hours. As the mixture is heated, its color changed from yellow to light brown to red. After the mixture was heated, acetone was added to the mixture, and the mixture was then refined by way of precipitation.

The powder composed of ultrafine metal particles (ultrafine composite metal particles) was then applied to a substrate in the same manner as with Example 1. However, the substrate was heated at 200° C. The ultrafine composite metal particles in the fine recesses were easily melted into copper interconnections. When the substrate was chemically and mechanically polished, the copper interconnections were well planarized without peel-off.

According to the present invention, as described above, it is possible to stably deposit an interconnection metal of good quality using ultrafine particles which contain the metal at least partly. The process can be used as a method of forming an interconnection to meet requirements for highly integrated semiconductor circuits, thus contributing the progress of a process of fabricating semiconductor devices.

Industrial Applicability

The present invention relates to a method of and an apparatus for forming an interconnection, and more particularly to a method of and an apparatus for forming a fine interconnection in a highly integrated circuit formed on a semiconductor substrate. According to the present invention, the method can be used as a method of forming an interconnection to meet requirements for highly integrated semiconductor circuits, thus contributing the progress of a process of fabricating semiconductor devices.

What is claimed is:

1. A method of forming an interconnection, comprising:

preparing a substrate having fine recesses formed in a surface thereof;

dispersing ultrafine particles in a predetermined solvent to produce an ultrafine particle dispersed liquid, wherein the utltrafine particles have a central region made of a metal component and the central region is surrounded by an organic compound which is chemically bonded to the central region;

supplying said ultrafine particle dispersed liquid to said fine recesses of said substrate;

heating said substrate to melt and bond the metal; and chemical mechanical polishing the surface of the substrate to remove an excessively attached metal therefrom, wherein said heating comprises heating said substrate in an inactive gas atmosphere containing a small amount of oxygen or ozone, and then heating said substrate in a pure inactive gas atmosphere.

2. A method according to claim 1, further comprising:

evaporating said solvent after said supplying said ultrafine particle dispersed liquid to said fine recesses of said substrate and before said heating said substrate to melt and bond the metal.

3. A method according to claim 1 or 2, wherein said covering layer made of an organic substance chemically bonded to said core comprises an ionic organic compound.

4. The method of claim 3, wherein said ionic organic compound is selected from the group consisting of a fatty acid having carbon number of at least 6, an alkylbenzene sulfonic acid, and an alkyl sulfonic acid.

5. A method according to claim 1, wherein said ultrafine particles have an average diameter ranging from 1 to 20 nm.

6. A method according to claim 1, wherein said ultrafine particle dispersed liquid has a predetermined surface tension to increase adhesiveness of said ultrafine particle dispersed liquid to said fine recesses of said substrate and/or areas surrounding said fine recesses.

7. A method according to claim 1, wherein said heating said ultrafine particles is carried out under the control of an atmosphere.

8. A method according to claim 7 or 1, wherein said heating said substrate is carried out at a temperature of 450° C. or lower.

9. A method of fabricating a semiconductor wafer by forming an interconnection on a surface of a substrate using a method according to claim 1.

* * * * *

UNITED STATES PATENT AND TRADEMARK OFFICE
CERTIFICATE OF CORRECTION

PATENT NO. : 6,730,596 B1  Page 1 of 1
DATED : May 4, 2004
INVENTOR(S) : Fukunaga et al.

It is certified that error appears in the above-identified patent and that said Letters Patent is hereby corrected as shown below:

Column 16,
Line 8, delete "at least 6" and insert therefor -- at least 5 --;
Line 23, delete "C." and insert therefor -- C --.

Signed and Sealed this

Twenty-seventh Day of July, 2004

JON W. DUDAS
*Acting Director of the United States Patent and Trademark Office*